(12) United States Patent
Kawaguchi et al.

(10) Patent No.: US 8,147,631 B2
(45) Date of Patent: Apr. 3, 2012

(54) METHOD FOR FORMING A LAMINATE

(75) Inventors: Mutsuyuki Kawaguchi, Amagasaki (JP); Tsuyoshi Amatani, Amagasaki (JP)

(73) Assignee: MEC Company Ltd., Amagasaki (JP)

( * ) Notice: Subject to any disclaimer, the term of this patent is extended or adjusted under 35 U.S.C. 154(b) by 0 days.

(21) Appl. No.: 12/708,657

(22) Filed: Feb. 19, 2010

(65) Prior Publication Data
US 2010/0236690 A1    Sep. 23, 2010

(30) Foreign Application Priority Data
Mar. 19, 2009    (JP) .................................. 2009-068499

(51) Int. Cl.
*B32B 41/00*    (2006.01)
(52) U.S. Cl. .......... 156/64; 156/350; 156/351; 156/367; 156/378; 156/379
(58) Field of Classification Search .................... 156/64, 156/350, 351, 367, 378, 379
See application file for complete search history.

(56) References Cited

U.S. PATENT DOCUMENTS

| 5,445,698 A | 8/1995 | Takano et al. | |
|---|---|---|---|
| 2001/0014410 A1 | 8/2001 | Mitsuhashi et al. | |
| 2008/0261020 A1 * | 10/2008 | Kawaguchi et al. | ....... 428/319.1 |
| 2008/0308964 A1 | 12/2008 | Amatani et al. | |

FOREIGN PATENT DOCUMENTS

| JP | 5-304361 | | 11/1993 |
|---|---|---|---|
| JP | 6-37452 | A | 2/1994 |
| JP | 7-115275 | A | 5/1995 |
| JP | 7-212039 | A | 8/1995 |
| JP | 2001-140081 | A | 5/2001 |
| JP | 2001-214297 | A | 8/2001 |
| JP | 2003-183016 | A | 7/2003 |
| JP | 2007-35995 | A | 2/2007 |
| JP | 2007-63578 | A | 3/2007 |
| JP | 2008-286602 | A | 11/2008 |
| JP | 2009-19266 | A | 1/2009 |

* cited by examiner

*Primary Examiner* — Katarzyna Wyrozebski Lee
*Assistant Examiner* — Joshel Rivera
(74) *Attorney, Agent, or Firm* — Knobbe Martens Olson & Bear LLP

(57) ABSTRACT

The method for forming a laminate of the present invention is a method for forming a laminate, comprising a silane coupling agent treatment step of applying an aqueous solution of a silane coupling agent onto a surface of a metal layer, and drying the resultant applied film to form a silane coupling agent coating, and a lamination step of laminating a resin layer on the silane coupling agent coating, these steps being continuously performed, wherein when the formed silane coupling agent coating is analyzed in the silane coupling agent treatment step by FT-IR with a reflection absorption spectrometry and then the peak area of Si—O is turned to a value less than a predetermined threshold value, at least one part of the aqueous solution of the silane coupling agent is renewed, thereby conducting the silane coupling agent treatment while the peak area is controlled into a predetermined range.

4 Claims, 1 Drawing Sheet

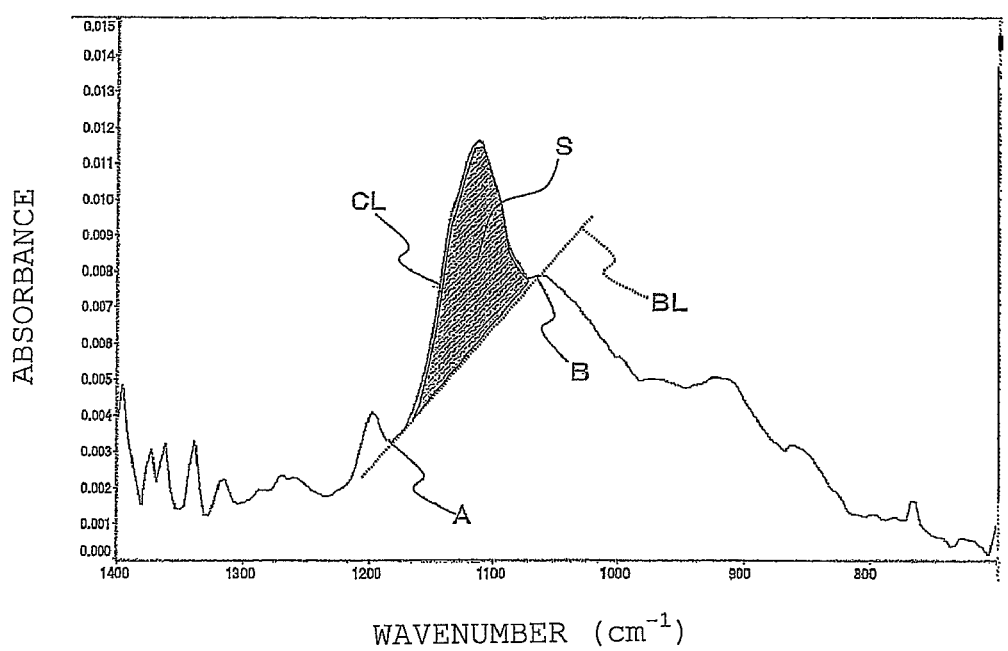

METHOD FOR FORMING A LAMINATE

BACKGROUND OF THE INVENTION

1. Field of the Invention

The present invention relates to a method for forming a laminate, wherein the following steps are continuously conducted: a silane coupling agent treatment step of applying an aqueous solution of a silane coupling agent onto a surface of a metal layer, and drying the resultant applied film to form a silane coupling agent coating; and a lamination step of laminating a resin layer on the silane coupling agent coating.

2. Description of Related Art

Hitherto, in the production of a printed wiring board, the following step is generally conducted in order to improve adhesive performance between a surface of a conductor made of a metal such as copper or copper alloy (metal surface) and an insulating resin of a solder resist, a prepreg or the like: the step of applying an aqueous solution of a silane coupling agent, or the like onto the metal surface, and then drying the resultant applied film (see, for example, Japanese Patent Application Laid-Open (JP-A) No. 5-304361, JP-A No. 6-37452, JP-A No. 7-115275, JP-A No. 7-212039, and JP-A No. 2007-35995).

About the aqueous silane coupling agent solution, it is necessary that the silane coupling agent is first dissolved in water so as to be hydrolyzed, thereby generating silanol groups (Si—OH groups). When the silanol groups react and bond with hydroxyl groups present in the metal surface, a silane coupling agent coating having an adhesive performance onto the insulating resin is formed on the metal surface.

In the silane coupling agent treatment step in the prior art, the aqueous silane coupling agent solution is exchanged whenever metal surfaces as described above are treated for a predetermined period (or a predetermined amount of the metal surfaces is treated). In this way, a fall in the adhesive performance is prevented. In the prior art, however, the timing for the exchange of the solution is decided according to empirical assumptions; therefore, the solution exchange may be performed although the adhesive performance is kept. As a result, much waste is generated against economy and work efficiency. Thus, costs for the production are not easily decreased.

It is known that whether or not the silane coupling agent coating is in a state that the coating can keep the adhesive performance can be checked by knowing the amount of Si present in the surface of the coating from a detailed analysis of the composition of the surface according to X-ray photoelectron spectrometry (XPS).

However, according to the measurement based on XPS, for example, the following problems are caused: (1) The measurement needs to be made under a vacuum condition; thus, much time is required therefor. (2) A machine therefor is expensive. (3) A user of the machine needs to receive training. Thus, the measurement is not easily made, in particular, in order to control silane coupling agent coatings when wiring boards are mass-produced.

SUMMARY OF THE INVENTION

In light of the actual situation, the present invention has been made, and an object thereof is to provide a method for forming a laminate which makes it possible to maintain the adhesive performance of each of silane coupling agent coatings onto a resin layer made of an insulating resin or the like even when a silane coupling agent treatment step is continuously conducted, and which also makes it possible to decrease the production costs.

The first method for forming a laminate of the present invention is a method for forming a laminate, comprising a silane coupling agent treatment step of applying an aqueous solution of a silane coupling agent onto a surface of a metal layer, and drying the resultant applied film to form a silane coupling agent coating, and a lamination step of laminating a resin layer on the silane coupling agent coating, these steps being continuously performed, wherein when the formed silane coupling agent coating is analyzed in the silane coupling agent treatment step by FT-IR with a reflection absorption spectrometry and then the peak area of Si—O is turned to a value less than a predetermined threshold value, at least one part of the aqueous solution of the silane coupling agent is renewed, thereby conducting the silane coupling agent treatment while the peak area is controlled into a predetermined range.

The second method for forming a laminate of the present invention is a method for forming a laminate, comprising a silane coupling agent treatment step of applying an aqueous solution of a silane coupling agent onto a surface of a metal layer, and drying the resultant applied film to form a silane coupling agent coating, and a lamination step of laminating a resin layer on the silane coupling agent coating, the steps being continuously performed, wherein when the formed silane coupling agent coating is analyzed in the silane coupling agent treatment step by FT-IR with a reflection absorption spectrometry and then the peak area of Si—O is turned to a value less than a predetermined threshold value, a condition for the silane coupling agent treatment is changed to increase the amount of Si in the surface of the formed silane coupling agent coating, thereby conducting the silane coupling agent treatment while the peak area is controlled into a predetermined range.

In the present invention, FT-IR (Fourier transform infrared spectrometry) with a reflection absorption spectrometry (RAS) is used as an analyzing manner, whereby the amount of Si present in the silane coupling agent coating surface can be directly measured in a short time. For this reason, before the adhesive performance between the resin layer and the metal layer declines, it is possible to renew at least one part of the aqueous silane coupling agent solution (first laminate-forming method) or increase the amount of Si in the silane coupling agent coating surface (second laminate-forming method). This makes it possible to maintain the adhesive performance between the coating surface and the resin layer easily even when the silane coupling agent treatment step is continuously conducted. Moreover, the state of the silane coupling agent coating can be rapidly grasped; thus, a useless solution-exchange can be prevented. In this way, the production costs can be decreased.

BRIEF DESCRIPTION OF THE DRAWING

FIG. 1 is a graph describing a method for measuring the peak area of Si—O.

DETAILED DESCRIPTION OF THE PREFERRED EMBODIMENTS

The present invention relates to a method for forming a laminate, wherein the following steps are continuously conducted: a silane coupling agent treatment step of applying an aqueous solution of a silane coupling agent onto a surface of a metal layer, and drying the resultant applied film to form a silane coupling agent coating; and a lamination step of laminating a resin layer on the silane coupling agent coating. In other words, the present invention is applicable to a laminate-forming method wherein the silane coupling agent treatment step and the lamination step are repeatedly conducted.

The silane coupling agent used in the present invention may be any silane coupling agent as far as the agent is a silane coupling agent exhibiting a coupling effect. From the viewpoint of adhesive performance, particularly suitable for the method of the present invention is a silane coupling agent containing at least one functional group selected from epoxy, amino, acryloxy, methacryloxy and vinyl groups.

Examples of the epoxy-group-containing silane coupling agent include 3-glycidoxypropylmethyldiethoxysilane, 2-(3,4-epoxycyclohexyl)ethyltrimethoxysilane, 2-glycidoxyethoxytrimethoxysilane, and 2-glycidoxyethyltriethoxysilane.

Examples of the amino-group-containing silane coupling agent include 3-aminopropyltrimethoxysilane, 3-aminopropyltriethoxysilane, N-2-(aminoethyl)-3-aminopropylmethyldimethoxysilane, N-2-(aminoethyl)-3-aminopropyltrimethoxysilane, N-2-(aminoethyl)-3-aminopropyltriethoxysilane, 3-triethoxysilyl-N-(1,3-dimethyl-butylidene)propylamine, N-phenyl-3-aminopropyltrimethoxysilane, and N-(vinylbenzyl)-2-aminoethyl-3-aminopropyltrimethoxysilane hydrochloride.

Examples of the acryloxy-group-containing silane coupling agent include 3-acryloxypropyltrimethoxysilane.

Examples of the methacryloxy-group-containing silane coupling agent include 3-methacryloxypropyltrimethoxysilane, 3-methacryloxypropyltriethoxysilane, 3-methacryloxypropylmethyldimethoxysilane, and 3-methacryloxypropylmethyldiethoxysilane.

Examples of the vinyl-group-containing silane coupling agent include vinyltrimethoxysilane, vinyltriethoxysilane, and vinyltrichlorosilane.

Other examples of the silane coupling agent include ureido-group-containing silane coupling agents such as 3-ureidopropyltriethoxysilane; mercapto-group-containing silane coupling agents such as 3-mercaptopropyltrimethoxysilane; and isocyanate-group-containing silane coupling agents such as 3-isocyanatepropyltriethoxysilane.

Of these examples, preferred are epoxy-group-containing silane coupling agents such as 3-glycidoxypropylmethyldiethoxysilane, 2-(3,4-epoxycyclohexyl)ethyltrimethoxysilane, 2-glycidoxyethoxytrimethoxysilane, and 2-glycidoxyethyltriethoxysilane. Since any epoxy group is a functional group having high thermal reactivity and further having optical reactivity, these compounds give a high adhesive performance not only to a thermosetting resin but also to a photocurable resin. In some cases, a resin used for a solder resist has one or more functional groups having both of photocurable property and thermosetting property; thus, epoxy-group-containing silane coupling agents are each effective.

The aqueous solution of the silane coupling agent used in the present invention may be prepared by dissolving such a silane coupling agent as recited above in ion exchange water, an acidic solution or the like. In this case, the concentration of the silane coupling agent in the aqueous solution may be appropriately adjusted in accordance with the kind of the silane coupling agent, and ranges preferably from 0.1 to 15% by weight, more preferably from 0.3 to 10% by weight, and even more preferably from 0.5 to 5% by weight. When the concentration is 0.1% or more by weight, the silane coupling agent can be caused to adhere onto the metal layer surface in an amount necessary for improving the adhesive performance onto the resin layer. When the concentration is 15% or less by weight, the solubility becomes good and further condensation reaction of the silanol groups can be restrained. Thus, for example, the number of exchanges of aqueous silane coupling agent solutions can be decreased.

When the silane coupling agent is dissolved in water and then the solution is stirred, the silane coupling agent undergoes hydrolysis reaction, whereby silanol groups (Si—OH groups) are generated. The method for the stirring in this case is not particularly limited, and may be, for example, a method of stirring the solution by use of a mechanical stirring means such as a magnetic stirrer. The concentration of the silanol groups can be grasped by analyzing the aqueous silane coupling agent solution by FT-IR, and then knowing the peak intensity (absorbance) of the Si—O stretching vibration of the silanol groups at the time of the analysis. The peak intensity increases gradually as the hydrolysis advances; however, the intensity gets constant when the hydrolysis is completed. From, for example, this time when the hydrolysis is completed, it can be decided that the aqueous silane coupling agent solution has been turned into a state that the solution is usable. More specifically, the concentration of the silanol groups in the aqueous silane coupling agent solution can be grasped by analyzing the aqueous silane coupling agent solution by FT-IR to obtain a spectrum, and measuring the intensity of a Si—O stretching vibration peak near a wavenumber of 900 $cm^{-1}$ in a difference spectrum obtained by removing the water spectrum from the obtained spectrum.

In the silane coupling agent treatment step in the present invention, the aqueous silane coupling agent solution having a temperature of, for example, about 10 to 40° C. is applied onto a metal surface layer (by dipping, spraying or the like), and then the resultant applied film is dried at an atmospheric temperature of about 25 to 100° C. for about 5 to 300 seconds to form a silane coupling agent coating. Thereafter, in order to remove an unreacted portion of the silane coupling agent, a rinsing step of rinsing the workpiece with water or the like is conducted as the need arises. Thereafter, a drying step may be further conducted.

When the silane coupling agent treatment step is continuously conducted, the thickness of the formed silane coupling agent coating (the amount of Si in the coating surface) decreases as the treating time elapses. A cause of the decrease in the Si amount in the coating surface is that the condensation of the silanol groups generated in the aqueous silane coupling agent solution advances between the groups so that the absolute amount of the silanol groups related directly to the adhesive performance is decreased. Thus, in the first laminate-forming method of the present invention, the formed silane coupling agent coating is analyzed in the silane coupling agent treatment step by FT-IR with a reflection absorption spectrometry. When the peak area of Si—O is then turned to a value less than a predetermined threshold value, at least one part of the aqueous silane coupling agent solution is renewed, thereby conducting the silane coupling agent treatment while the peak area is controlled into a predetermined range. In other words, when the peak area of Si—O is measured by FT-IR, the amount of Si present in the silane coupling agent coating surface can be grasped in a short time. In this way, at least one part of the aqueous silane coupling agent solution can be renewed before the adhesive performance between the resin layer and the metal layer falls. For this reason, the adhesive performance onto the resin layer can easily be maintained even when the silane coupling agent treatment step is continuously conducted. Examples of the case represented by the wording "at least one part of the aqueous silane coupling agent solution is renewed" include a case where the whole of the aqueous silane coupling agent solution is exchanged for a fresh aqueous silane coupling agent solution, and a case where the aqueous silane coupling agent solution is partially removed and a fresh aqueous silane coupling agent solution is replenished by the removed solution amount.

According to the second laminate-forming method of the present invention, in the above-mentioned silane coupling agent treatment step, the formed silane coupling agent coating is analyzed by FT-IR with a reflection absorption spectrometry. When the peak area of Si—O is then turned to a value less than a predetermined threshold value, a condition for the silane coupling agent treatment is changed to increase the amount of Si in the surface of the formed silane coupling agent coating, thereby conducting the silane coupling agent treatment while the peak area is controlled into a predetermined range. By the second laminate-forming method of the present invention also, the amount of Si present in the silane coupling agent coating surface can be grasped in a short time in the same manner as by the first laminate-forming method. In this way, the condition for the silane coupling agent treatment is changed before the adhesive performance between the resin layer and the metal layer falls, whereby the amount of Si present in the silane coupling agent coating surface can be increased. For this reason, the adhesive performance onto the resin layer can easily be maintained even when the silane coupling agent treatment step is continuously conducted.

Specific examples of the method for increasing the amount of Si present in the silane coupling agent coating surface in the second laminate-forming method include a method of raising the temperature for drying the applied film made from the aqueous silane coupling agent solution and formed on the metal layer surface, and a method of making the time for drying the applied film long. A specific example of conditions therefor will be described in Examples later.

In the first and, second laminate-forming methods of the present invention, the peak area of Si—O is obtained specifically by analyzing the formed silane coupling agent coating by FT-IR with a reflection absorption spectrometry and then measuring the peak area of Si—O near a wavenumber of 1110 $cm^{-1}$ in the resultant spectrum.

With reference to FIG. 1, the method for measuring the "Si—O peak area" will be further described hereinafter. FIG. 1 is a graph showing the IR spectrum, wherein the wavenumber is represented by the transverse axis and the absorbance is represented by the vertical axis. A straight line is drawn for connecting a measurement point A at a wavenumber of 1180 $cm^{-1}$ to a measurement point B at a wavenumber of 1070 $cm^{-1}$. This is used as a base line BL. The area S of a region surrounded by this base line BL and an IR spectrum curve CL is measured. In this way, the Si—O peak area is obtained.

The peak area of the silane coupling agent coating good in adhesive performance onto the resin layer is varied depending on the used silane coupling agent, and is, for example, 0.020 or more. The adhesive strength between the metal layer and the resin layer is varied depending on the kind of the resin, conditions for applying the aqueous silane coupling agent solution, the form of the metal layer surface, the pretreatment thereof, and so on.

It is sufficient for each of the first and second laminate-forming methods of the present invention that the "predetermined threshold" and the "predetermined range" are each appropriately set depending on the silane coupling agent to be used, a required adhesive strength (peel strength), and so on. For example, in the following manner, the adhesive performance onto the resin layer can be kept good: a manner of dissolving the silane coupling agent in water and then stirring the resultant for 120 minutes in order to prepare an aqueous silane coupling agent solution; forming a silane coupling agent coating without delay; setting the Si—O peak area measured by the above-mentioned measuring method about the resultant coating as the "predetermined threshold value"; and further setting a range from 10 to 100% (preferably 35 to 100%) of this "predetermined threshold value" as the "predetermined range".

It is sufficient for the present invention that the measurement frequency of the peak area of Si—O is appropriately decided depending on the used silane coupling agent, a required adhesive strength and so on. For example, by measuring the Si—O peak area at intervals of a constant period (at intervals of one day or one week), the peak area can easily be controlled into the predetermined range.

As described above, the Si—O peak area of the silane coupling agent coating good in adhesive performance onto the resin layer is varied depending onto the silane coupling agent. In the case of, for example, 2-(3,4-epoxycyclohexyl) ethyltrimethoxysilane, a Si—O peak area of 0.05 or more permits a peel strength of 0.50 N/mm or more to be certainly kept under conditions in Examples described later. In the case of 3-methacryloxypropyltrimethoxysilane, a Si—O peak area of 0.02 or more permits a peel strength of 0.50 N/mm or more to be certainly kept under conditions in Examples described later. In the case of 3-aminopropyltrimethoxysilane, a Si—O peak area of 0.07 or more permits a peel strength of 0.50 N/mm or more to be certainly kept under conditions in Examples described later.

In the present invention, the metal on which the silane coupling agent coating is formed, that is, the underlying metal may be any metal, such as copper, nickel, zinc, tin, aluminum or titanium, or any alloy thereof. Preferred is copper or any copper alloy, which may be referred to merely as "copper" hereinafter, which is in particular frequently used as a conductor. The metal layer surface may be made rough to some degree by chemical polishing with a micro-etching agent or the like, or by mechanical polishing with a buff from the viewpoint of an improvement in the adhesive performance. In order to make the adhesive performance better, an adhesive metal layer such as a copper/tin alloy layer may be formed onto the metal layer surface. In the case of the formation of a copper/tin alloy layer on the surface of copper, an immersing tin-plating solution is brought into contact with the copper surface to form a substituted tin coating, so that the tin diffuses into the underlying copper, whereby the copper/tin alloy layer can thinly be formed onto the copper surface.

In the present invention, the resin laminated over the metal layer surface to interpose the silane coupling agent coating therebetween is not particularly limited, and may be, for example, a resin used for a dry film resist, a liquid resist, an etching resist, a plating resist, an electroplating resist, a prepreg, a solder resist, an adhesive, an interlayer dielectric in a buildup printed wiring board, a semiconductor encapsulation resin, or some other article or purpose. Examples thereof include the following resins:

Thermoplastic resins such as acrylonitrile/styrene copolymer resin (AS resin), acrylonitrile/butadiene/styrene copolymer resin (ABS resin), fluorine-contained resin, polyamide, polyethylene, polyethylene terephthalate, polyvinylidene chloride, polyvinyl chloride, polycarbonate, polystyrene, polysulfone, polypropylene, and liquid crystal polymer; thermosetting resins such as epoxy resin, phenol resin, polyimide, polyurethane, bismaleimide/triazine resin, modified polyphenylene ether, and cyanate ester; and photocurable resins such as acrylic resin. These resins may be modified with a functional group, or may be reinforced with glass fiber, aramid fiber, some other fiber, or the like.

In the present invention, after the silane coupling agent treatment step, a lamination step is conducted wherein the layer of the above-mentioned resin (resin layer) is laminated onto the resultant silane coupling agent coating. The method for the lamination at the time is not particularly limited, and may be appropriately selected in accordance with the resin material to be laminated. For example, lamination press, laminating, or applying may be adopted.

EXAMPLES

The following will describe examples of the present invention together with comparative examples. The present invention should not be interpreted to be limited to the examples.

Example 1

Preparation of an Aqueous Silane Coupling Agent Solution 2-(3,4-Epoxycyclohexyl)ethyltrimethoxysilane (silane coupling agent) was dissolved in ion exchange water to yield an aqueous silane coupling agent solution (concentration: 1.0% by weight) to be used in Example 1.

(Formation of a Silane Coupling Agent Coating)

As a test substrate, prepared was an electrolytic copper foil piece (product name: 3EC-III, manufactured by Mitsui Mining & Smelting Co., Ltd., thickness: 35 µm) cut into a size of 100 mm×100 mm. This was immersed in a 10% by weight sulfuric acid solution for 30 seconds to clean the copper foil piece surfaces. The test substrate was then rinsed with water and dried. Next, this test substrate was subjected to immersion swinging treatment (at 30° C. for 30 seconds) with a substituting tin-plating solution (T-9900) manufactured by Mec Co., Ltd., and then rinsed with water to form a tin-plating treatment layer on each surface of the copper foil piece. Just thereafter, the workpiece was subjected to immersion swinging treatment with an aqueous dilute nitric acid solution (at 35° C. for 10 seconds) to remove outmost layer regions of the tin-plating treatment layers. The workpiece was then rinsed with water to form a copper/tin alloy layer on each of the copper foil piece surfaces. Next, the test substrate, on which the copper/tin alloy layers were formed, was subjected to immersion swinging treatment (at 35° C. for 30 seconds) in the aqueous silane coupling agent solution (1 L) in a state shown in Table 1, pre-dried (at 60° C. for 20 seconds), and then rinsed with water (at 25° C. for 50 seconds). Finally, the test substrate was dried (at 90° C. for 20 seconds) to form silane coupling agent coatings. In Table 1, the wording "continuous use" means that the following was carried out: the same copper/tin-alloy-layer-formed test substrates as described above, the number of which is 100, are continuously subjected to immersion swinging treatment over 8 hours per day (each of the substrates is treated at 35° C. for 30 seconds) using, as a fresh solution, an aqueous silane coupling agent solution (1 L) yielded by dissolving the silane coupling agent in water and then stirring the solution for 120 minutes. According to the "continuous use", test substrates having a total area 1 m² are treated per day. In Table 1, the "complete exchange" means an exchange of the whole of the aqueous silane coupling agent solution for the same fresh solution as described above, that is, an aqueous silane coupling agent solution (1 L) yielded by dissolving the silane coupling agent in water and then stirring the solution for 120 minute.

(Evaluation)

About the silane coupling agent coating yielded by use of the aqueous silane coupling agent solution in each state shown in Table 1, an FT-IR analyzer (product name: NICOLET 380, manufactured by Thermo Fischer Scientific Inc.) was used to measure the Si—O peak area. Each of the measurements was made by reflection absorption spectrometry (RAS) under the following conditions: detector: DLaTGS/KBr, accessory: RAS, resolving power: 8 cm$^{-1}$, estimation time-number: 128, and incident angle: 75°. The amount of Si in the resultant silane coupling agent coating was measured by XPS. A measuring machine used therefor was an X-ray photoelectron spectrometer (product name: JPS-9010MC) manufactured by JEOL Ltd. The measurement was made using an Mg ray source under the following conditions: energy step: 0.1 eV, path energy: 50 eV, and cumulative time: 200 ms. The strength of the Si 2p3/2 peak was measured. Furthermore, a solder resist (product name: SR-7200G, manufactured by Hitachi Chemical Co., Ltd.) was applied onto the silane coupling agent coating formed on the glossy surface of the electrolytic copper foil piece, which was the test substrate, and dried. Thereafter, under a highly accelerated temperature and humidity stress test (HAST) condition (temperature: 130° C., and humidity: 85%), the test piece was kept for 25 hours; after the 25 hours, the peel strength of the solder resist film was measured according to JIS C 6481. The results are shown in Table 1. In the case of a peel strength of 0.50 N/mm or more, a decision that the adhesive performance can be certainly kept is permissible.

Example 2

An evaluation was made in the same way as in Example 1 except that: a measurement was neither made just after the preparation nor after 30 to 90 minutes from the stirring; without making the complete exchange after the continuous use for 4 weeks, the temperature and the time for pre-drying the applied film were changed to "80° C. and 40 seconds", respectively; and afterwards, the continuous use under the pre-drying conditions (temperature and time) was performed. The results are shown in Table 1.

Example 3

An evaluation was made in the same way as in Example 1 except that: a measurement was neither made just after the preparation nor after 30 to 90 minutes from the stirring; without making the complete exchange after the continuous use for 4 weeks, the temperature and the time for pre-drying the applied film were changed to "80° C. and 20 seconds", respectively; and afterwards, the continuous use under the pre-drying conditions (temperature and time) was performed. The results are shown in Table 1.

Example 4

An evaluation was made in the same way as in Example 1 except that: a measurement was neither made just after the preparation nor after 30 to 90 minutes from the stirring; without making the complete exchange after the continuous use for 4 weeks, the temperature and the time for pre-drying the applied film were changed to "60° C. and 40 seconds", respectively; and afterwards, the continuous use under the pre-drying conditions (temperature and time) was performed. The results are shown in Table 1.

Examples 5 to 9 and Comparative Example 1

In each of Examples 5 to 9 and Comparative Example 1, an evaluation was made in the same way as in Example 1 except that: the aqueous silane coupling agent solution was changed as shown in Tables 2 and 3, and measurements were made in each state shown in Tables 2 and 3; and no measurement was made by XPS. The results are shown in Tables 2 and 3. In Example 6, an aqueous silane coupling agent solution (1 L) yielded by dissolving the silane coupling agent in water and then stirring the solution for 180 minutes was used as a fresh solution to perform the continuous use. In Table 2, the wording "half exchange" means that a half of the aqueous silane coupling agent solution is removed and a fresh solution, that is, a fresh aqueous silane coupling agent solution yielded by dissolving the silane coupling agent in water and then stirring the solution for 120 minutes is replenished by the removed solution amount.

TABLE 1

| | Aqueous silane coupling agent solution | Aqueous silane coupling agent solution state | Si—O peak area | Si amount (XPS peak intensity) | Peel strength (N/mm) |
|---|---|---|---|---|---|
| Example 1 | 1.0%-By-weight solution of 2-(3,4-epoxycyclohexyl)ethyl-trimethoxysilane in water | Just after preparation | 0.015 | 7000 | 0.20 |
| | | After stirring for 30 minutes | 0.052 | 21000 | 0.53 |
| | | After stirring for 60 minutes | 0.116 | 30000 | 0.59 |
| | | After stirring for 90 minutes | 0.144 | 37000 | 0.65 |
| | | After stirring for 120 minutes | 0.144 | 37000 | 0.65 |
| | | After continuous use for 2 weeks | 0.110 | 29000 | 0.61 |
| | | After continuous use for 4 weeks | 0.055 | 22000 | 0.52 |
| | | *1) Just after complete exchange after continuous use for 4 weeks | 0.140 | 37000 | 0.67 |
| | | *2) Just after further continuous use (for 2 weeks) from time *1 | 0.122 | 31000 | 0.62 |
| | | Just after further continuous use (for 2 weeks) from time *2 | 0.053 | 22000 | 0.53 |
| Example 2 | 1.0%-By-weight solution of 2-(3,4-epoxycyclohexyl)ethyl-trimethoxysilane in water | After stirring for 120 minutes | 0.144 | 37000 | 0.65 |
| | | After continuous use for 2 weeks | 0.110 | 29000 | 0.61 |
| | | After continuous use for 4 weeks | 0.055 | 22000 | 0.52 |
| | | *3) Just after change of pre-drying conditions after continuous use for 4 weeks | 0.085 | 26000 | 0.59 |
| | | *4) Just after further continuous use (for 2 weeks) from time *3 | 0.065 | 24000 | 0.55 |
| | | Just after further continuous use (for 2 weeks) from time *4 | 0.053 | 22000 | 0.53 |
| Example 3 | 1.0%-By-weight solution of 2-(3,4-epoxycyclohexyl)ethyl-trimethoxysilane in water | After stirring for 120 minutes | 0.144 | 37000 | 0.65 |
| | | After continuous use for 2 weeks | 0.110 | 29000 | 0.61 |
| | | After continuous use for 4 weeks | 0.055 | 22000 | 0.52 |
| | | *5) Just after change of pre-drying conditions after continuous use for 4 weeks | 0.082 | 25000 | 0.58 |
| | | *6) Just after further continuous use (for 2 weeks) from time *5 | 0.063 | 23000 | 0.55 |
| | | Just after further continuous use (for 2 weeks) from time *6 | 0.051 | 21000 | 0.53 |
| Example 4 | 1.0%-By-weight solution of 2-(3,4-epoxycyclohexyl)ethyl-trimethoxysilane in water | After stirring for 120 minutes | 0.144 | 37000 | 0.65 |
| | | After continuous use for 2 weeks | 0.110 | 29000 | 0.61 |
| | | After continuous use for 4 weeks | 0.055 | 22000 | 0.52 |
| | | *7) Just after change of pre-drying conditions after continuous use for 4 weeks | 0.081 | 25000 | 0.58 |
| | | *8) Just after further | 0.060 | 22000 | 0.53 |

TABLE 1-continued

| Aqueous silane coupling agent solution | Aqueous silane coupling agent solution state | Si—O peak area | Si amount (XPS peak intensity) | Peel strength (N/mm) |
|---|---|---|---|---|
| | continuous use (for 2 weeks) from time *7 Just after further continuous use (for 2 weeks) from time *8 | 0.050 | 20000 | 0.50 |

TABLE 2

| | Aqueous silane coupling agent solution | Aqueous silane coupling agent solution state | Si—O peak area | Peel strength (N/mm) |
|---|---|---|---|---|
| Example 5 | 0.5%-By-weight solution of 2-(3,4-epoxycyclohexyl)ethyltrimethoxysilane in water | Just after preparation | 0.007 | 0.10 |
| | | After stirring for 30 minutes | 0.059 | 0.55 |
| | | After stirring for 60 minutes | 0.102 | 0.59 |
| | | After stirring for 90 minutes | 0.102 | 0.60 |
| | | After stirring for 120 minutes | 0.102 | 0.59 |
| | | After continuous use for 2 weeks | 0.054 | 0.52 |
| | | *9) Just after complete exchange after continuous use for 2 weeks | 0.104 | 0.60 |
| | | *10) Just after further continuous use (for 2 weeks) from time *9 | 0.054 | 0.52 |
| | | *11) Just after complete exchange of solution at time *10 | 0.102 | 0.62 |
| | | *12) Just after further continuous use (for 2 weeks) from time *11 | 0.056 | 0.53 |
| | | *13) Just after complete exchange of solution at time *12 | 0.103 | 0.60 |
| | | Just after further continuous use (for 2 weeks) from time *13 | 0.050 | 0.51 |
| Example 6 | 3.0%-By-weight solution of 2-(3,4-epoxycyclohexyl)ethyltrimethoxysilane in water | Just after preparation | 0.033 | 0.42 |
| | | After stirring for 30 minutes | 0.111 | 0.62 |
| | | After stirring for 60 minutes | 0.167 | 0.64 |
| | | After stirring for 90 minutes | 0.244 | 0.65 |
| | | After stirring for 120 minutes | 0.288 | 0.65 |
| | | After stirring for 150 minutes | 0.288 | 0.64 |
| | | After stirring for 180 minutes | 0.288 | 0.65 |
| | | After continuous use for 2 weeks | 0.142 | 0.61 |
| | | After continuous use for 4 weeks | 0.055 | 0.55 |
| | | *14) Just after complete exchange after continuous use for 4 weeks | 0.290 | 0.65 |
| | | *15) Just after further continuous use (for 2 weeks) from time *14 | 0.151 | 0.62 |
| | | Just after further continuous use (for 2 weeks) from time 15* | 0.056 | 0.57 |
| Example 7 | 1.0%-By-weight solution of 2-(3,4-epoxycyclohexyl)ethyltrimethoxysilane in water | After stirring for 120 minutes | 0.144 | 0.65 |
| | | After continuous use for 2 weeks | 0.110 | 0.61 |
| | | After continuous use for 4 weeks | 0.055 | 0.52 |
| | | 16) Just after half exchange after continuous use for 4 weeks | 0.104 | 0.60 |
| | | *17) Just after further continuous use (for 2 weeks) from time *16 | 0.056 | 0.52 |
| | | *18) Just after half exchange of solution at time *17 | 0.106 | 0.62 |
| | | Just after further continuous use (for 2 weeks) from time *18 | 0.053 | 0.53 |

TABLE 3

| | Aqueous silane coupling agent solution | Aqueous silane coupling agent solution state | Si—O peak area | Peel strength (N/mm) |
|---|---|---|---|---|
| Example 8 | 1.0%-By-weight solution of 3-methacryloxypropyltrimethoxysilane in water | Just after preparation | 0.012 | 0.20 |
| | | After stirring for 30 minutes | 0.021 | 0.53 |
| | | After | 0.085 | 0.65 |

TABLE 3-continued

| Aqueous silane coupling agent solution | Aqueous silane coupling agent solution state | Si—O peak area | Peel strength (N/mm) |
|---|---|---|---|
| | stirring for 60 minutes After stirring for 90 minutes | 0.138 | 0.72 |
| | After stirring for 120 minutes | 0.138 | 0.72 |
| | After continuous use for 1 week | 0.022 | 0.55 |
| | *19) Just after complete exchange after continuous use for 1 week | 0.140 | 0.73 |
| | *20) Just after further continuous use (for 1 week) from time *19 | 0.021 | 0.52 |
| | *21) Just after complete exchange of solution at time *20 | 0.137 | 0.71 |
| | *22) Just after further continuous use (for 1 week) from time *21 | 0.022 | 0.55 |
| | *23) Just after complete exchange of solution at time *22 | 0.139 | 0.73 |
| | *24) Just after further continuous use (for 1 week) from time *23 | 0.021 | 0.53 |
| | *25) Just after complete exchange of solution at time *24 | 0.139 | 0.73 |
| | *26) Just after further continuous use (for 1 week) from time *25 | 0.022 | 0.56 |
| | *27) Just after complete exchange of solution at time *26 | 0.137 | 0.70 |
| | *28) Just after further continuous use (for 1 week) from time *27 | 0.020 | 0.52 |
| | *29) Just | 0.138 | 0.71 |

TABLE 3-continued

| | Aqueous silane coupling agent solution | Aqueous silane coupling agent solution state | Si—O peak area | Peel strength (N/mm) |
|---|---|---|---|---|
| | | after complete exchange of solution at time *28 | | |
| | | *30) Just after further continuous use (for 1 week) from time *29 | 0.021 | 0.53 |
| | | *31) Just after complete exchange of solution at time *30 | 0.140 | 0.73 |
| | | Just after further continuous use (for 1 week) from time 31* | 0.023 | 0.55 |
| Example 9 | 1.0%-By-weight solution of 3-aminopropyltrimethoxysilane in water | Just after preparation | 0.017 | 0.10 |
| | | After stirring for 30 minutes | 0.049 | 0.21 |
| | | After stirring for 60 minutes | 0.112 | 0.55 |
| | | After stirring for 90 minutes | 0.150 | 0.59 |
| | | After stirring for 120 minutes | 0.150 | 0.59 |
| | | After continuous use for 2 weeks | 0.102 | 0.57 |
| | | After continuous use for 4 weeks | 0.072 | 0.52 |
| | | *32) Just after complete exchange after continuous use for 4 weeks | 0.148 | 0.60 |
| | | *33) Just after further continuous use (for 2 weeks) from time *32 | 0.100 | 0.56 |
| | | Just after further continuous use (for 2 weeks) from time 33* | 0.071 | 0.52 |
| Comparative Example 1 | 1.0%-By-weight solution of 2-(3,4-epoxycyclohexyl)ethyltrimethoxysilane in water | After stirring for 120 minutes | 0.144 | 0.64 |
| | | After continuous use for 2 weeks | 0.115 | 0.62 |
| | | After | 0.053 | 0.54 |

TABLE 3-continued

| Aqueous silane coupling agent solution | Aqueous silane coupling agent solution state | Si—O peak area | Peel strength (N/mm) |
|---|---|---|---|
| | continuous use for 4 weeks After continuous use for 6 weeks | 0.019 | 0.22 |
| | After continuous use for 8 weeks | 0.008 | 0.11 |

As shown in Tables 1 to 3, in Examples 1 to 9, silane coupling agent coatings capable of giving a peel strength of 0.50 N/mm or more were able to be continuously formed. On the other hand, in Comparative Example 1, the peel strength continuously lowered as the Si—O peak area lowered. As a result of the continuous use for 6 weeks, the peel strength turned below 0.50 N/mm.

What is claimed is:

1. A method for forming a laminate, comprising a silane coupling agent treatment step of applying an aqueous solution of a silane coupling agent onto a surface of a metal layer, and drying the resultant applied film to form a silane coupling agent coating, and a lamination step of laminating a resin layer on the silane coupling agent coating, these steps being continuously performed,
    wherein when the formed silane coupling agent coating is analyzed in the silane coupling agent treatment step by FT-IR with a reflection absorption spectrometry and then the peak area of Si—O is turned to a value less than a predetermined threshold value, at least one part of the aqueous solution of the silane coupling agent is renewed, thereby conducting the silane coupling agent treatment while the peak area is controlled into a predetermined range,
    wherein the predetermined threshold value is 0.020.

2. A method for forming a laminate, comprising a silane coupling agent treatment step of applying an aqueous solution of a silane coupling agent onto a surface of a metal layer, and drying the resultant applied film to form a silane coupling agent coating, and a lamination step of laminating a resin layer on the silane coupling agent coating, the steps being continuously performed,
    wherein when the formed silane coupling agent coating is analyzed in the silane coupling agent treatment step by FT-IR with a reflection absorption spectrometry and then the peak area of Si—O is turned to a value less than a predetermined threshold value, a condition for the silane coupling agent treatment is changed to increase the amount of Si in the surface of the formed silane coupling agent coating, thereby conducting the silane coupling agent treatment while the peak area is controlled into a predetermined range,
    wherein the predetermined threshold value is 0.020.

3. The method for forming a laminate according to claim 2, wherein the temperature for drying the applied film is raised, thereby increasing the amount of Si in the surface of the silane coupling agent coating.

4. The method for forming a laminate according to claim 2, wherein the time for drying the applied film is made long, thereby increasing the amount of Si in the surface of the silane coupling agent coating.

* * * * *